United States Patent [19]

Hallford

[11] 4,186,352

[45] Jan. 29, 1980

[54] SIGNAL CONVERTER APPARATUS

[75] Inventor: Ben R. Hallford, Wylie, Tex.

[73] Assignee: Rockwell International Corporation, El Segundo, Calif.

[21] Appl. No.: 889,171

[22] Filed: Mar. 23, 1978

[51] Int. Cl.² .................. H04B 1/26; H01P 5/10; H01P 5/16
[52] U.S. Cl. .................................. 325/446; 333/26; 333/117; 333/238
[58] Field of Search ............... 325/445, 446; 330/4.9; 332/37 R, 47, 52; 333/5, 11, 26, 84 M, 117, 238, 246, 247

[56] References Cited

U.S. PATENT DOCUMENTS

| | | | |
|---|---|---|---|
| 2,579,751 | 12/1951 | Muchmore | 333/26 X |
| 3,818,385 | 6/1974 | Mouw | 333/26 |
| 4,063,176 | 12/1977 | Milligan et al. | 333/26 X |

Primary Examiner—Paul L. Gensler
Attorney, Agent, or Firm—Bruce C. Lutz; Howard R. Greenberg; H. Fredrick Hamann

[57] ABSTRACT

Microstrip technology is utilized in illustrating new and improved versions of baluns, hybrid junctions and half-wave balanced mixers and full-wave double balanced mixers.

14 Claims, 15 Drawing Figures

SIGNAL CONVERTER APPARATUS

THE INVENTION

The present invention is generally concerned with electronics and, more specifically, with high frequency mixing circuits.

In the prior art, Robert B. Mouw proposed a type of hybrid junction and mixer in U.S. Pat. No. 3,512,090. He improved upon the structural design of this mixer in U.S. Pat. No. 3,818,385. However, both of these patents illustrated designs which are not practical from a cost-conscious engineering design standpoint. The present design is directed not only to a design which is economical to build, but also one which provides improved performance capabilities, is simpler and easier to construct and patentably distinguishes thereover.

It is, therefore, an object of the present invention to provide an improved microstrip balun and hybrid junction design.

Other objects and advantages of the present invention may be ascertained from a reading of the specificiation and appended claims in conjunction with the drawings wherein:

Figure 6:
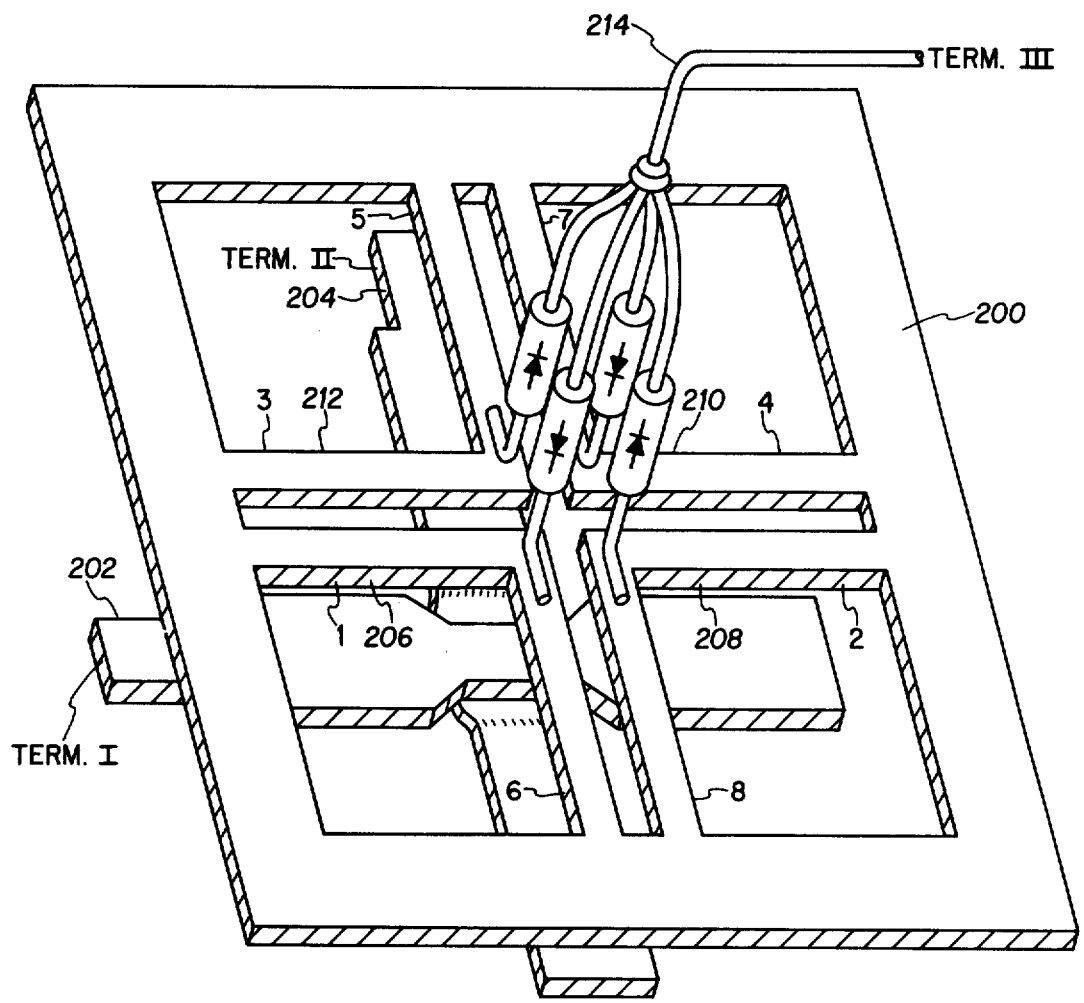
FIG. 6 is an illustration of a combination of FIGS. 2 and 5.
Figure 7:
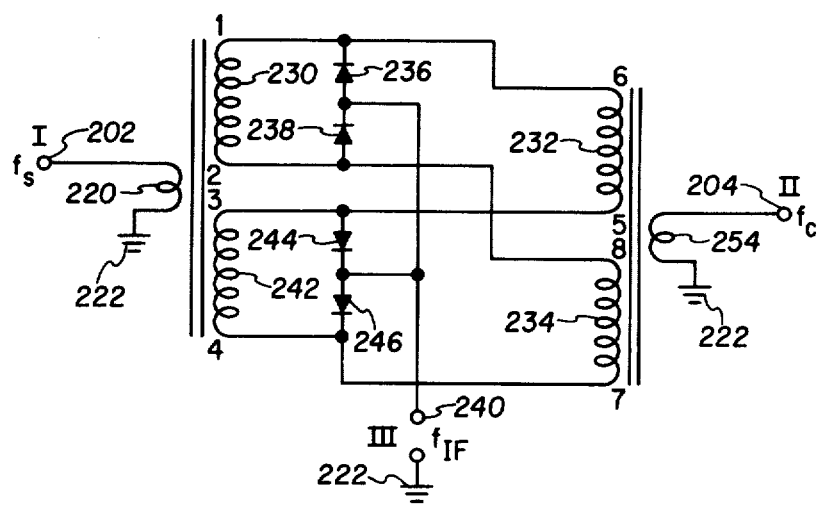
Figure 8:
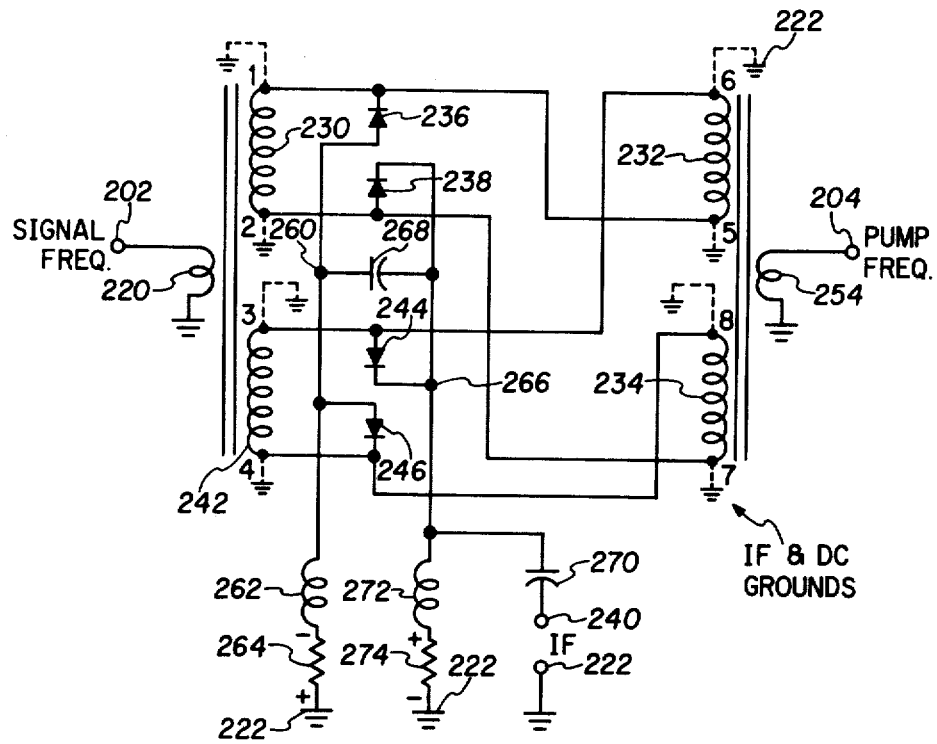
Figure 9:
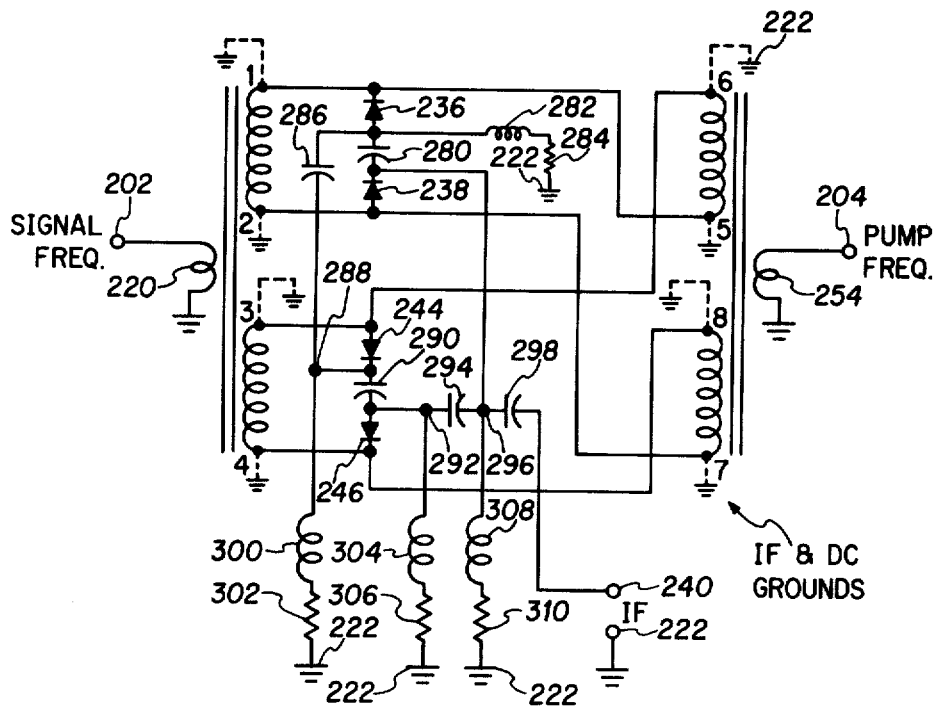
Figure 10:
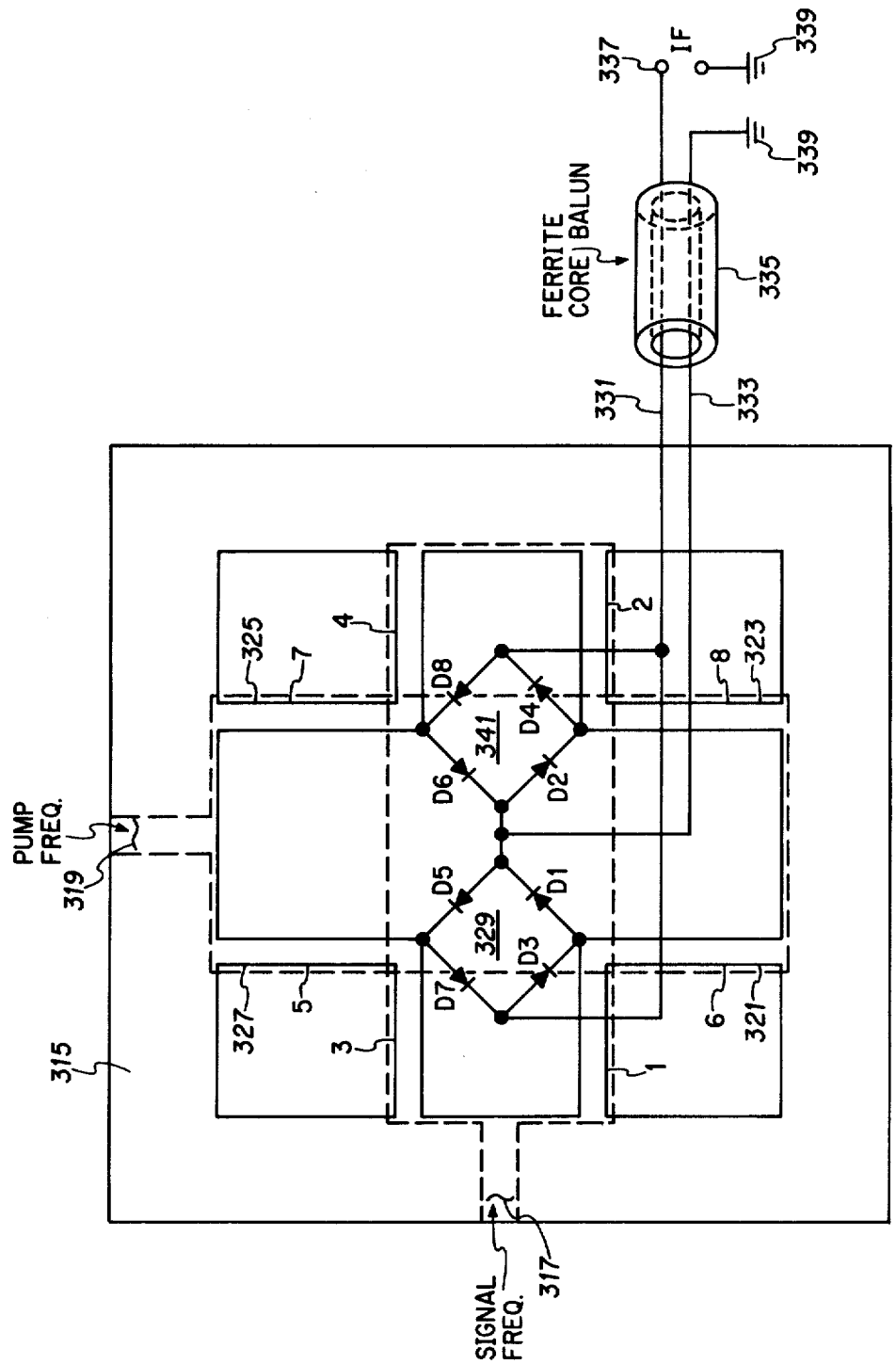
Figure 11:
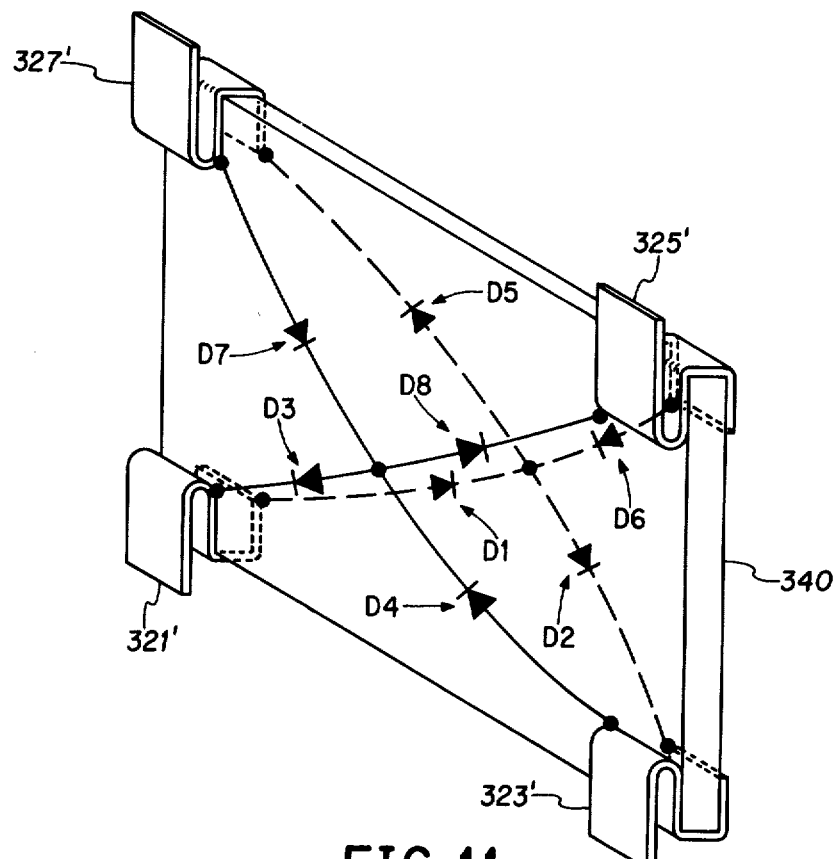
Figure 12:
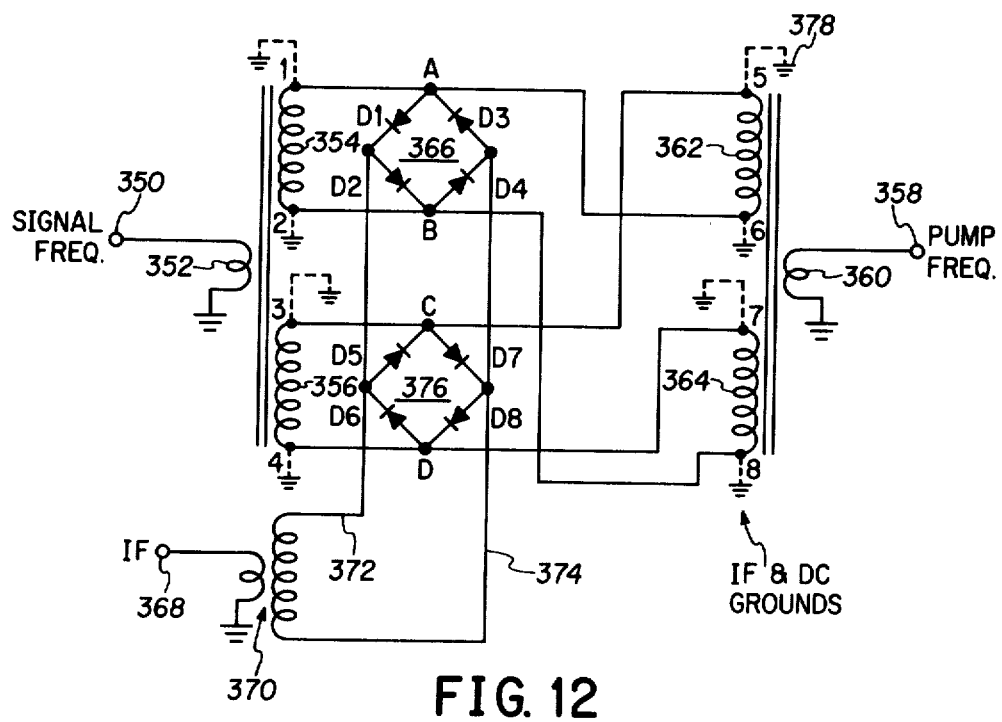
Figure 13:
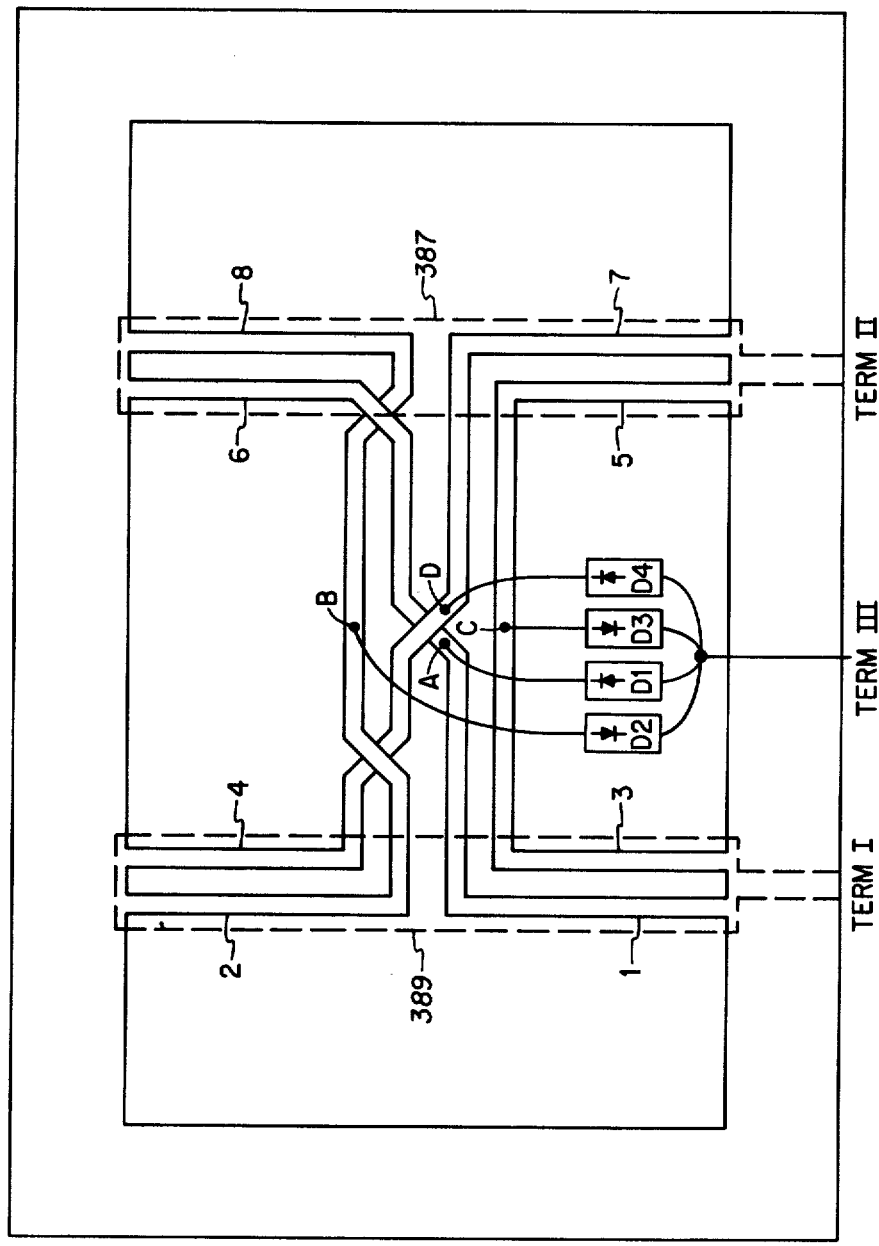
Figures 14, 15:
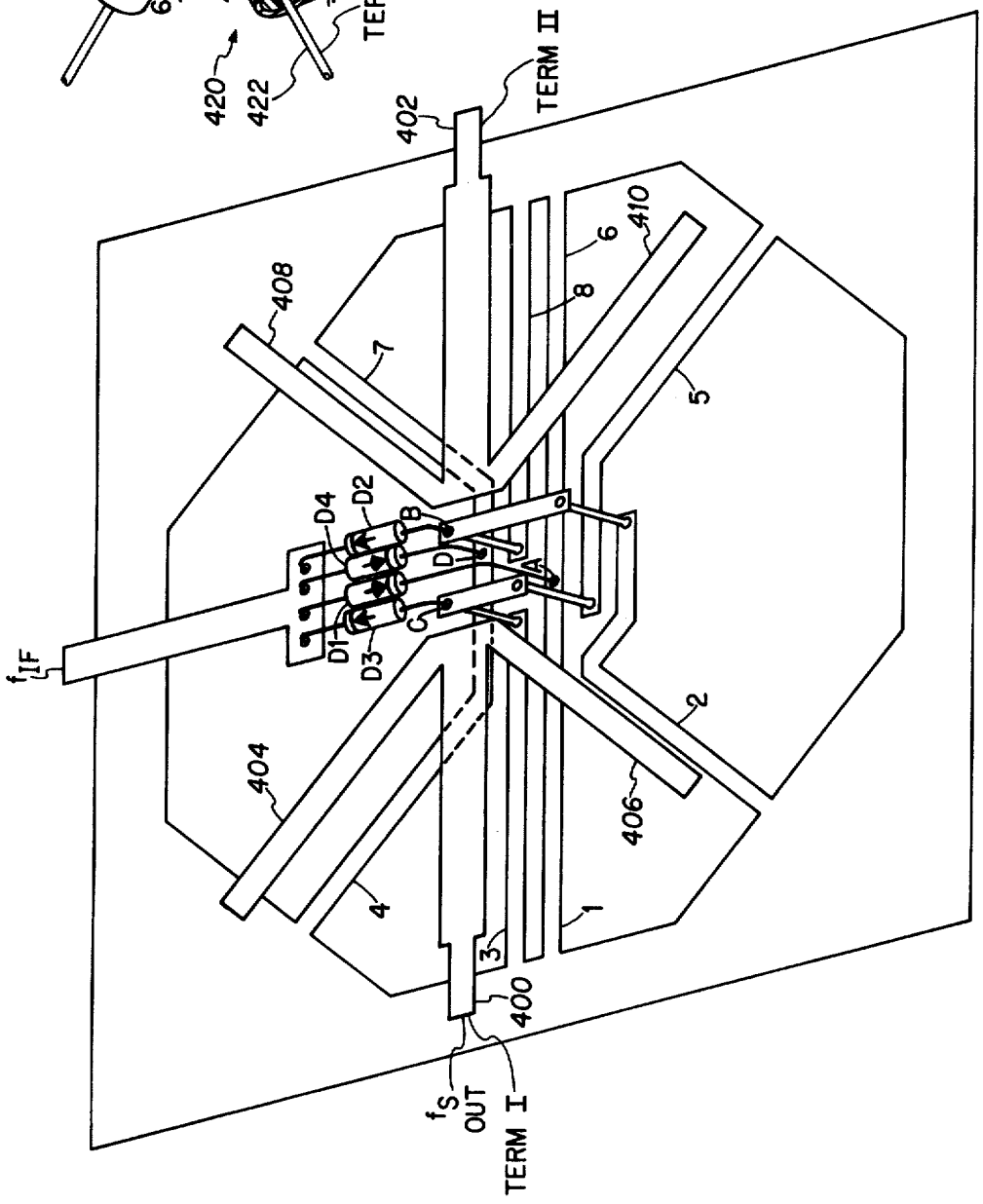

FIG. 7 provides the equivalent circuit of the apparatus of FIG. 6;

FIG. 8 illustrates a modification of FIG. 6 for higher amplitude signals;

FIG. 9 is an alternate implementation of the high signal amplitude connections for the apparatus of FIG. 6;

FIG. 10 illustrates a full-wave double balanced upconverter using a pair of ring quad diodes for full-wave operation;

FIG. 11 is an illustration of a way in which a pair of star quads could be identically used in place of the ring quads shown in FIG. 10;

FIG. 12 is an electrical equivalent circuit of the apparatus shown in FIG. 10 or FIG. 10 as modified by FIG. 11, FIG. 13 is an illustration of a different structural embodiment of a frequency converter having the same electrical equivalent as illustrated in FIG. 7;

FIG. 14 illustrates, in exploded isometric format, a further mechanical configuration having as its electricl equivalent the circuit of FIG. 7; and FIG. 15 illustrates the inventive concept using coaxial transmission means rather than microstrip technology.

DETAILED DESCRIPTION

Figure 1:
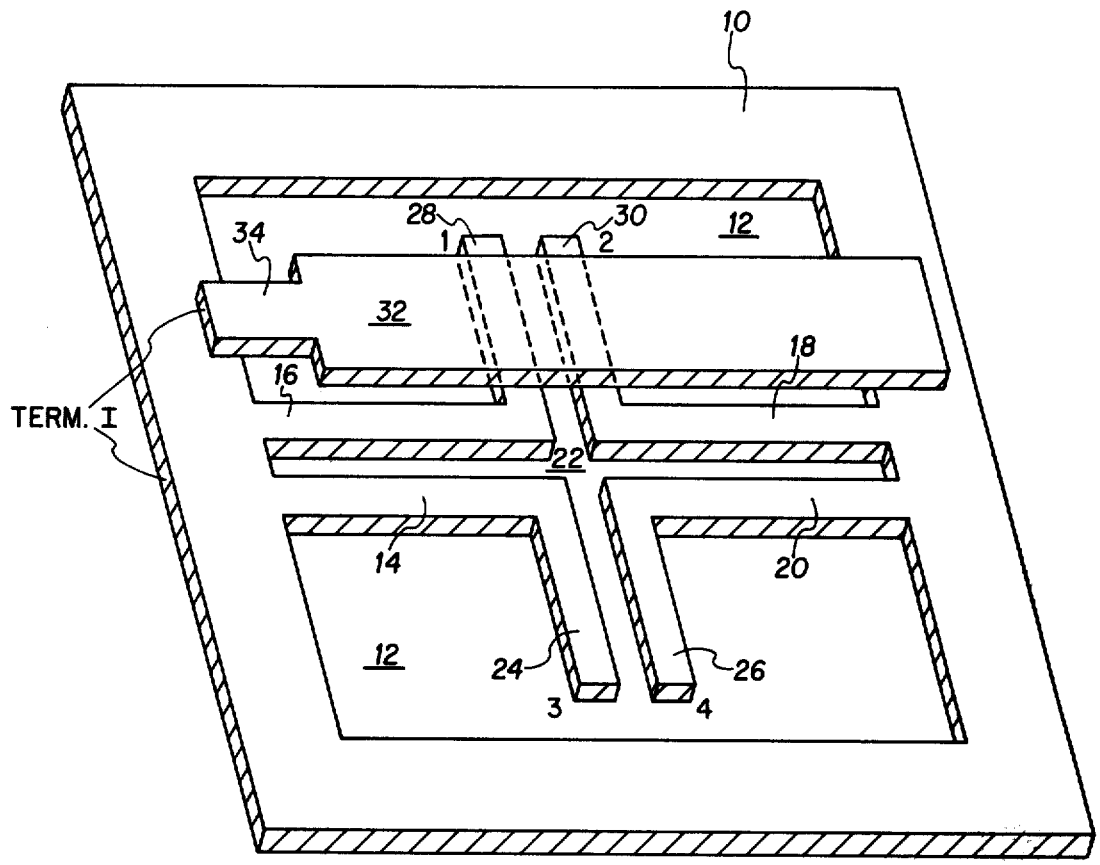
FIG. 1 is an illustration of a microstrip construction of a balun.

In FIG. 1, a ground plane 10 completely circumscribes an opening designated as 12. Extending from the ground plane 10 are a series of balun secondary circuit paths or signal coupling means 14, 16, 18 and 20. These circuit paths meet at a common intersection designated as 22 and the open space between these arms form two open area arms of a cross with intersection 22 at the center. The path 14, and the other paths previously mentioned, form multipart paths with the remainder portion of path 14 being designated as 24. In this specification, the term "path" includes L-shaped, as well as straight, curved or other shaped secondary circuit paths. A further extension of path 20 designated as 26 with paths 24 and 26 forming a first output terminal of the balun. Paths 16 and 18 turn at the intersection 22 and the portions of the current paths are designated 28 and 30 as they leave the intersection 22. These two paths form a second balun output terminal. Normally, all the circuit paths mentioned thus far would be attached to one side of some type of dielectric material, such as a printed circuit board. On the other side, there would be a further circuit path or transmission line means such as 32 in FIG. 1. A terminal connection portion which is necked down from the normal path width is designated as 34, which portion 34 maintains the desired input line impedance in the presence of a ground plane. Current path 32 overlies the entire length of paths 14, 16, 18 and 20. The portion 34 of path 32 in conjunction with the ground plane 10 in the area immediately juxtaposed 34 comprises a terminal which is designated in FIG. 1 as Terminal I. For the purposes of explanation later in the specification, paths 28, 30, 24 and 26 have also been labeled 1 through 4 respectively. As will be discussed later, the induced potential in multipart paths 14 and 16 increases as the distance from ground plane 10 increases until it reaches a maximum at intersection 22. At any point along path 14, the potential is identical to a corresponding point on path 16. This parallel type action occurs between all adjacent secondary circuit paths through the rest of the descriptive material in this specification.

In FIG. 2, a ground plane is again shown and is designated in four parts for convenience in describing the operation. These four parts are designated as 37, 39, 41 and 43. A multipart current path first designated as 45 extends from ground plane 37 toward an intersection area designated as 47 and then turns to form a new section of path designated as 49 before becoming a part of or connected to ground plane 39. Thus, portions 45 and 49 form one multipart current path from ground plane 37 to 39 after approaching a central intersection 47. A further L-shaped multipart path comprising sections 51 and 53 extend from ground plane 39, to intersection 47 and to ground plane 41. A further multipart path comprising sections 55 and 57 extend from ground plane 41 to ground plane 43 and finally a circuit path comprising sections 59 and 61 extend from ground plane 43 to ground plane 37. The open space between the various multipart paths of FIG. 2 creates an image in the form of a cross somewhat similar to that described in connection with FIG. 1. A terminal line means having front and back portions 63 and 65 is illustrated and performs substantially the same function as transmission line means 32 of FIG. 1. An extension 67 of this transmission line means in conjunction with ground plane 39 forms terminal I for this hybrid junction. As will be noted, the area between 63 and 65 is necked down or constricted to accommodate the design of another transmission line means having parts 69, 71 and 73. The part 71 is a bridge over the constricted portion between transmission line portions 63 and 65. A projection 75 of this transmission line means (69, 71 and 73) in conjunction with ground plane 41 forms terminal II of the hybrid junction. Third and/or fourth terminals can be formed between multipart paths in the area of the intersection 47. The referenced Mouw patents illustrate a design which would correspond to having as output junctions those that are diagonally opposed. It will be determined that the connections herein can be made much on the basis of the balun of FIG. 1 in that the connections can be made to adjacent multipart paths. Again, some type of dielectric other than air is normally utilized between the transmission line means comprising sections 63, 65, 69, 73 and the remaining multipart circuit or coupling paths (i.e., printed circuit board material) although air may be used if suitable support is found for the relative spacing. Also, the bridge 71 could be removed if it were desired to place this transmission line means on the opposing side of the multipart current paths. In a manner similar to that of FIG. 1, the transmission line means 63 and 65 extend substantially from ground plane 39 to ground plane 43 while the combination transmission line means 69 and 73 extends from ground plane 41 to ground plane 37.

The paths 49, 59, 51, 57, 53, 45, 55 and 61 are also labeled 1 through 8, respectively, as an aid in describing other circuit configurations later in this specification.

Figure 3A:
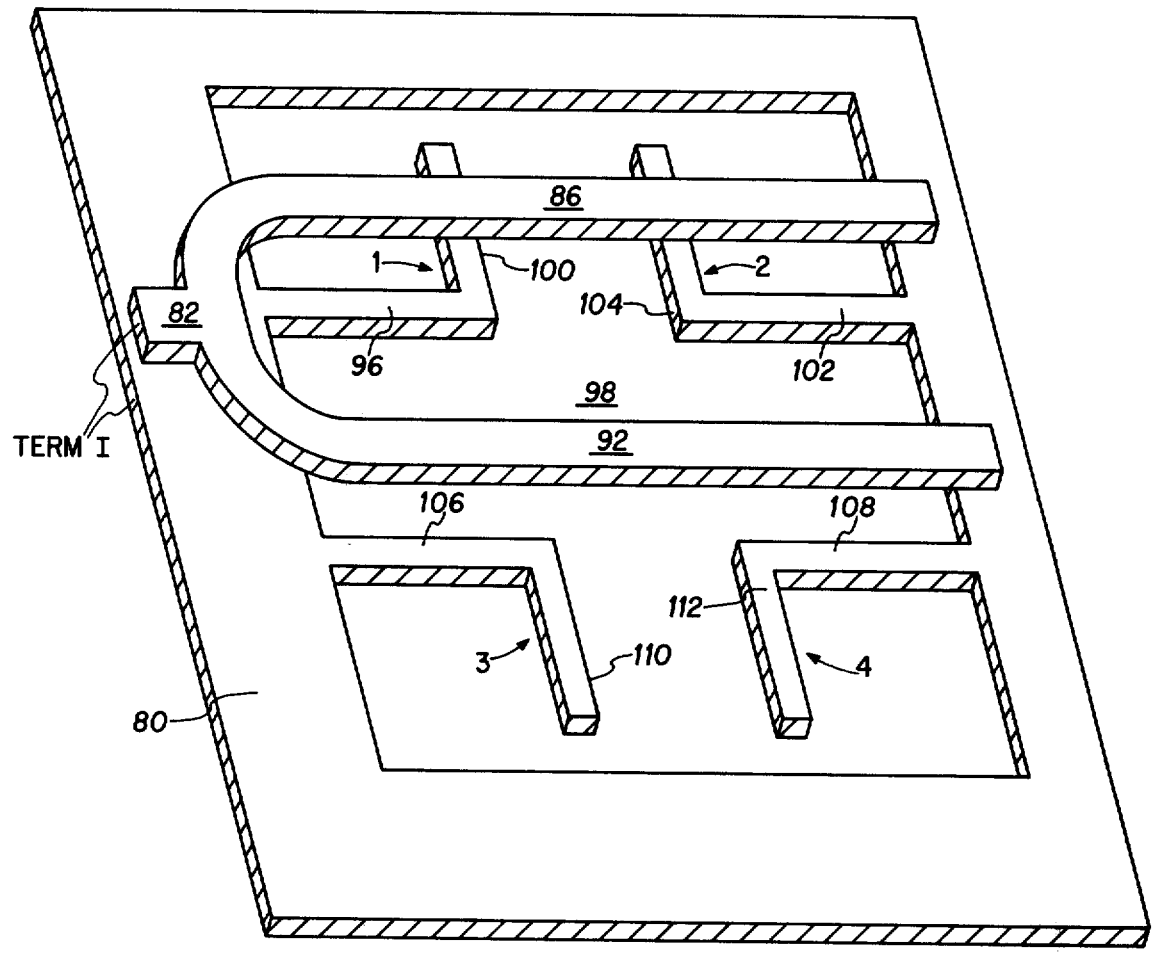
FIGS. 3a and 3b show a microstrip balun and an equivalent circuit using the teachings of the prior art applied to the present balun microstrip approach.

In FIG. 3a, a terminal I comprises a ground plane or reference area 80 and a tab or transmission line terminal 82. Tab 82 forms a portion of a conductive area which is split or bifurcated into primary balun line section 86 as one leg and primary balun line 92 as a second conductive leg. The bifurcated leg 86 coacts with a multipart current path 96 connected at one end to ground plane 80 and after approaching intersection 98, turns to form a terminal 1 otherwise designated as 100. Leg 86 also coacts with a multipart conductor 102 which extends from ground plane 80 toward an intersection 98 and then changes direction to become parallel with path 100. This extension, labeled 2, is also provided with a designator 104. The conductor 92 coacts in a similar manner with multipart portions 106 and 108. These two conductive strips or portions after approaching intersection 98, turn to form leads 3 and 4 otherwise designated as 110 and 112, respectively.

Figure 3B:
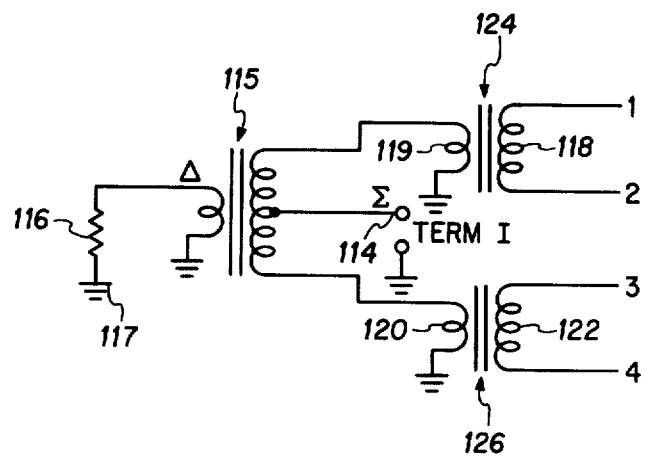

In FIG. 3b, an equivalent circuit for the apparatus of FIG. 3a is provided wherein terminal I is provided with a designator 114. Lead 114 is connected to the center tap of a winding on a transformer generally designated as 115. A secondary of transformer 115 is connected through a load impedance 116 to ground 117. The ends of the primary winding of transformer 115 are connected to windings 119 and 120 of transformers 124 and 126, respectively. These transformers 124 and 126 have secondary windings designated respectively as 118 and 122. The ends or leads of secondary winding 118 are labeled 1 and 2 to correspond with the outputs obtained on multipart current paths 100 and 104 of FIG. 3a. The ends or leads of secondary winding 122 are labeled 3 and 4 to correspond with current paths 110 and 112 of FIG. 3a.

The transformer 115 may not be immediately apparent but is obtained by the action of signals applied between terminal 82 and ground plane 80 of FIG. 3a wherein the signal is split and supplied as equal phase and polarity signals to the primary paths 86 and 92 of the respective baluns. As will be realized by those skilled in the art, the interaction between terminal 82 and ground plane 80 forms an apparent load impedance to signal sources which is represented by load impedance 116 of FIG. 3b.

Figure 4:
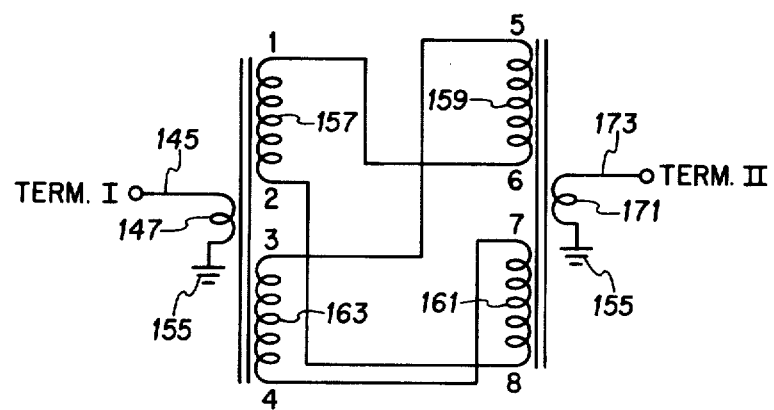
FIG. 4 is an electrical equivalent of the hybrid junction of FIG. 2.

In FIG. 4, a lead designated as terminal I is numbered 145 and is connected to a primary winding 147 having secondary windings 157 and 163. The other end of winding 147 is connected to ground 155. Transformer winding 157 has terminal leads designated as 1 and 2 with lead 1 being connected to a terminal lead 6 on a winding 159. Lead 2 is connected to a terminal lead 8 on a winding designated as 161. The secondary winding 163 has a terminal lead 3 connected to a terminal lead 5 of winding 159. A terminal lead 4 of secondary winding 163 is connected to terminal lead 7 of winding 161. Winding 159 is coupled to a winding 171 which is connected between ground 155 and a terminal II lead 173. Winding 161 is also coupled to winding 171.

Figure 2:
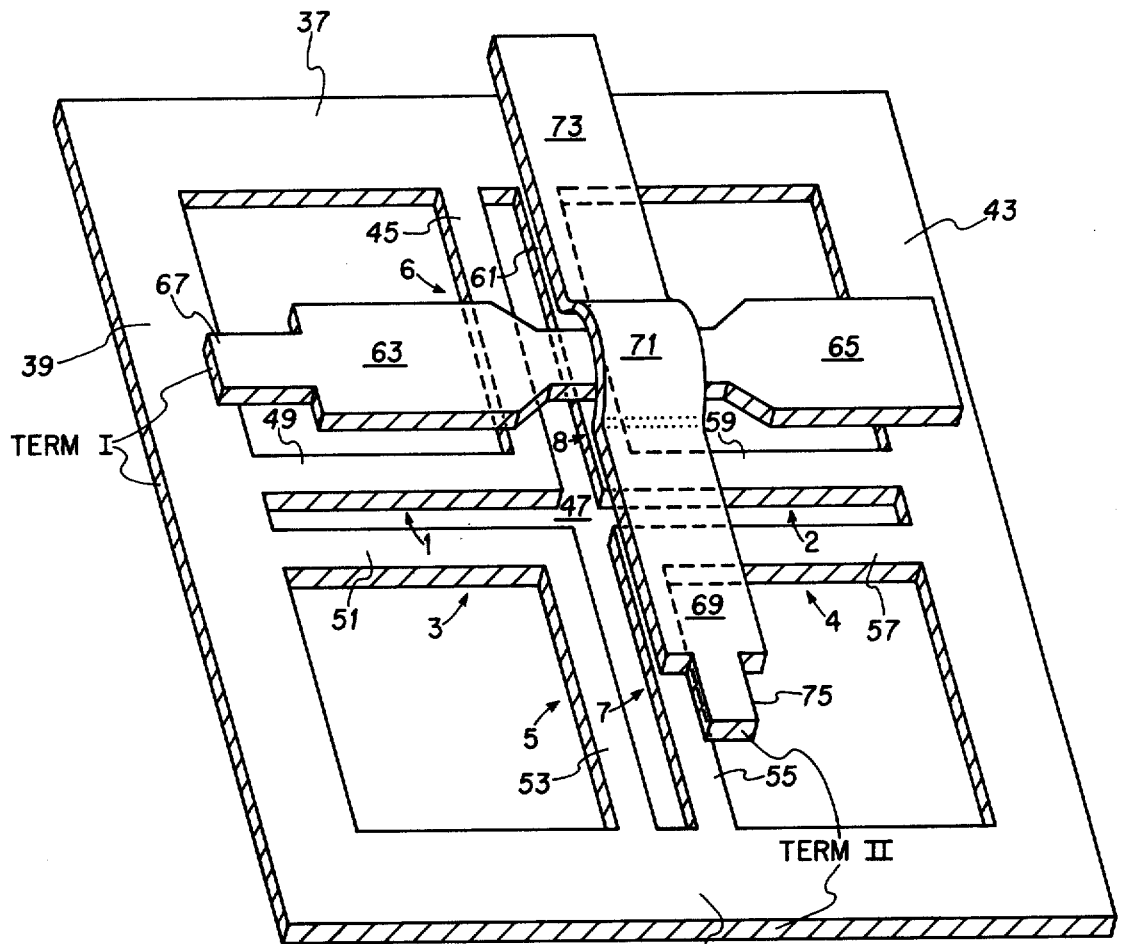
FIG. 2 is a hybrid junction using the basic balun design of FIG. 1.

The electrical circuit of FIG. 4 is the high frequency electrical equivalent circuit of FIG. 2 and terminals I and II have the same meaning in either of the figures.

Figure 5:
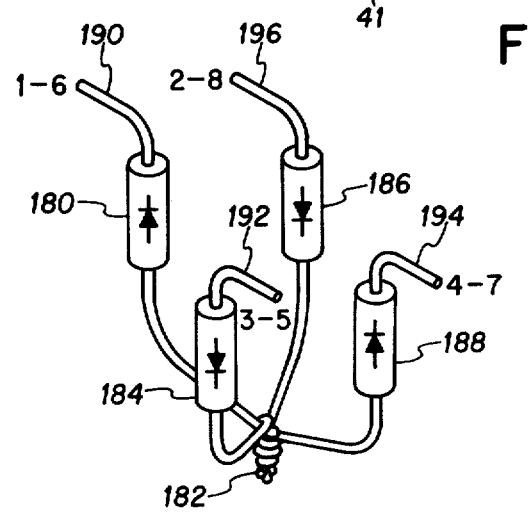
FIG. 5 illustrates diodes utilized in providing a frequency converter providing either upconverter or downconverter performance if added to the layout of FIG. 2.

In FIG. 5, a star connection of four diodes is illustrated with four diodes 180, 184, 186 and 188 connected to a common IF terminal 182. Diodes 180 and 188 have their anodes connected to terminal 182 while diodes 184 and 186 have their cathodes connected to terminal 182. The other end of each of these diodes is labeled to show the appropriate connection to the equivalent circuit of FIG. 4 so as to obtain a circuit as will be illustrated by FIG. 7. In addition, the unattached lead of diode 180 is designated as 190 and in FIG. 2 would be connected to the intersection of the nonlinear portions of paths 45 and 49 (also designated as 1-6 in FIG. 2). A lead 192, at the other end of diode 184 would be connected to the intersection of the portions 51 and 53 of the second current path (3-5) of FIG. 2. A lead 194 at the other end of the diode 188 would be connected to the junction of the portions 55 and 57 of the third coupling path (4-7). A final lead 196 of diode 186 would be connected to the junction of the remaining current path (2-8) portions 59 and 61.

FIG. 6 is an illustration of the apparatus of FIG. 2 except that it is inverted and has the diodes of FIG. 5 attached in a manner similar to that described above. Thus, there is a ground plane 200, a first terminal transmission line means 202, a second terminal transmission line means 204, and a plurality of multipart paths 206, 208, 210 and 212. Attached to each of these multipart paths is a diode which has its other end connected to a lead 214 and is labeled terminal III. The numbers 1 through 8 are used to designate the same relative points of connection in the equivalent circuit of FIG. 4.

In FIG. 7, an equivalent circuit is provided of the configuration of FIG. 6. Input terminal I for the signal frequency is designated 202 as shown in FIG. 6 and it is connected to a primary 220 having the other end thereof connected to ground 222. A first and secondary windings 230 and 242 are coupled to primary 220. Winding 230 has leads corresponding to conductive paths 1 and 2 in FIG. 6 and is so designated by the numbers 1 and 2 in the circuit diagram. Lead 1 of winding 230 is connected to lead 6 of a winding 232 while lead 2 of winding 230 is connected to lead 8 of a winding 234. A pair of diodes 236 and 238 are connected across leads 1 and 2 of winding 230 with a junction point therebetween directly connected to an IF signal terminal means 240, which forms the IF frequency terminal or terminal III. The IF signal is connected between terminal 240 and ground 222 which, in FIG. 6, is synonymous with ground plane 200. Winding 242 has leads labeled 3 and 4. Lead 3 is connected to lead 5 of winding 232 while lead 4 is connected to lead 7 of winding 234. A pair of diodes 244 and 246 are connected as shown across leads 3 and 4 and have a junction therebetween connected to IF signal terminal means 240. Windings 232 and 234 are coupled to a winding 254 which has one end connected to ground 222 and has the other end connected to a carrier frequency terminal labeled terminal II and designated as 204 both in FIGS. 6 and 7.

FIG. 8 uses the same numbers as used in FIG. 7 where appropriate and provides additional designations for the circuitry used to isolate the diodes by polarity. Thus, the anode of diode 236 is connected to a junction point 260 which is further connected to the anode of diode 246. It is also connected through an inductive winding 262 and a resistor 264 to ground 222. The cathode of diodes 238 and 244 are connected to a common junction point 266. A capacitor 268 provides an a.c. (IF & RF) connection between junction points 260 and 266. A further capacitor 270 is connected between junction point 266 and IF signal terminal means 240. An inductive winding 272, having a high impedance at IF & RF is connected at one end to junction point 266 and is connected at the other end to a resistor 274 which is connected to ground 222. Each of the leads 1 through 8 of the windings 230, 232, 234 and 242 show a dash line connection to ground 222 to illustrate that these leads are connected to IF and DC grounds, although not connected to signal frequency and pump frequency grounds. The windings 262 and 272 are separate inductors used for isolation. Thus, the circuitry of FIG. 8 is merely that of FIG. 6 or FIG. 7 except that the diodes are interconnected to output circuitry using a pair of capacitors, a pair of inductors and a pair of resistors for isolating the IF terminal means. While the connections illustrated in FIG. 7 operate perfectly satisfactory with low signal levels, the diode isolation of FIG. 8 is required for optimum results with high signal amplitudes to prevent the self bias of one set of diodes from forward biasing the opposite polarity set of diodes.

FIG. 9 again uses the same numbers as used in connection with FIG. 7 with the additional circuitry being provided with new designations. The cathode of diode 238 is connected through a capacitor 280 to the anode of diode 236. An inductor winding 282 is connected from the anode of diode 236 to ground 222 after passing through a resistor 284. A capacitor 286 is connected between the anode of diode 236 and a junction point 288. Junction point 288 is connected to the cathode of diode 244 and is also connected through a capacitor 290 to a junction point 292. Junction point 292 is connected to the anode of diode 246 and is also connected through a capacitor 294 to a junction point 296. Junction point 296 is connected to the cathode of diode 238 and is also connected through a capacitor 298 to output terminal 240, which is the IF signal terminal means. An inductor winding 300 is connected in series with a resistor 302 between junction point 288 and ground 222. A similar winding 304 is connected in series with the resistor 306 between junction point 292 and ground 222. A winding 308 is connected in series with a resistor 310 between junction point 296 and ground 222.

In FIG. 10, an exaggerated representational drawing is provided from the ground plane side of the apparatus when connected for full wave double balanced frequency converter operation. A ground plane 315 is illustrated with a signal frequency terminal 317 shown in dash lines since it is on the far side. A pump frequency terminal line means 319 is also illustrated in dash lines. The conductive elements or transmission lines connected to terminals 317 and 319 are coupled to the multipart paths in the same manner as discussed in connection with previous circuits of FIGS. 1, 2 and 6. FIG. 10 also has multipart paths 321, 323, 325 and 327 having the component parts labeled 1 through 8 as used previously. A first quad diode set 329 is connected to multipart paths 321 and 327 and is also connected to leads or lines 331 and 333 which are connected through a ferrite core balun 335 to output terminals 337 and ground 339, respectively. A second quad diode set 341 is connected to multipart paths 323 and 325 and is also connected to output leads 331 and 333. These diodes are labeled D1 through D8. These labels are used to provide ease of correpondence with the diodes in FIGS. 11 and 12.

In FIG. 11, a pair of star quad diode configurations are illustrated connected to conductive strips labeled 321', 323', 325' and 327' to illustrate the approprite coupling paths of FIG. 10 to which they are connected. The diodes D1 through D8 are labeled to provide the same output electrical connection as is obtained in FIG. 10. In other words, lead 333 of FIG. 10 would be connected to the intersection of the four diodes D1, D2, D5 and D6. Lead 331, on the other hand, is connected to the intersection of diodes D3, D4, D7 and D8 exactly as illustrated in FIG. 10. The four terminals 323' through 327' may be attached to a dielectric 340 with the diodes attached to the two sides of the dielectric 340 and to the terminals 321' through 327'.

In FIG. 12, a signal frequency is applied at an input terminal 350 and is coupled from a winding 352 to a pair of windings designated as 354 and 356. The windings 354 and 356 have their leads labeled 1, 2, 3, and 4, as utilized previously and correspond to the portions of paths 321 through 327 in FIG. 10. A pump frequency terminal 358 is connected to a winding 360 which, in turn, is coupled to two windings 362 and 364, and are labeled 5 through 8 to illustrate the portions of the paths 321 through 327 of FIG. 10. A first ring quad 366 corresponding to quad 329 of FIG. 10 is shown connected between leads 1 and 2, as well as between leads 8 and 6 and has input signals being applied from an IF terminal 368 and a set of windings 370 on a pair of leads 372 and 374. A second ring quad 376 corresponds to the ring quad 341 of FIG. 10 and is connected to leads 3 through 5, as well as 4 through 7 and again is connected to receive IF signals on leads 372 and 374. As illustrated in FIGS. 8 and 9, several points in the circuit are connected to a ground 378 by dash lines to illustrate that these points are connected to IF and DC ground, although not forming a part of the signal frequency and pump frequency ground.

FIG. 13, whose equivalent circuit is also that of FIG. 7, illustrates another configuration for practicing the invention where all the terminals are on the same side of the board. There are some instances where it is highly desirable to have all of the terminals on one side. Again, this is a representation of the board without showing the dielectric between conductors. The dash lines show the position of the two main or central conductor conductive strips 387 and 389 which overlie the paths labeled 1 through 8. These paths 1 through 8 are the same as found in previous figures such as FIG. 6 for ease in tracing the similarity and placement of diodes. The inner sections of the conductors are also labeled A through D so that it will be easy to determine how to convert this configuration to the double balanced modulator configuration of FIG. 12. A further advantage of this configuration is that there is adequate space for the diodes to lay flat against the board rather than the upright configuration suggested in the embodiment illustrated in FIG. 6.

In FIG. 14, another representation in isometric format is illustrated of the inventive concept. The terminals I and II are designated 400 and 402 with terminal 400 having legs 404 and 406 extending back at an angle from the main conductor associated with terminal 400. Terminal II has legs 408 and 410 extending back at an angle from the main conductor 402. The cooperating or grounded conductive paths are labeled 1 through 8 in a manner identical to that of FIG. 13. Some of the conductors are connected by plated through holes in a dielectric separating the conductive paths. Thus, FIG. 14 illustrates an embodiment in which there are no laboriously constructed crossovers such as 71 in FIG. 2. FIG. 14, like FIG. 13, has the advantage that there is adequate space for the diodes to lay down on the board and minimize the space required in the vertical direction from the board.

In FIG. 15, another representation in isometric format is illustrated of the inventive concept. In this approach to practicing the invention, a first coaxial cable 420 is illustrated with a terminal I central conductor or transmission line means 422, and a shield conductor or balun secondary which has been split longitudinally to form two lengthwise sections. Each of these lengthwise sections are then split circumferentially at the middle of cable 420 to divide the sections into parts 1 and 2, as well as parts 3 and 4. A second coaxial cable generally designated as 424 has a central conductor or transmission line means 426, which is also labeled terminal II. This coaxial cable is also modified so that its shield conductor is divided into four equal sections, as mentioned above in connection with coaxial cable 420. This yields sections 5, 6, 7 and 8. The sections 1 through 8 correspond with the secondary circuit paths similarly labeled in various other figures, such as in FIG. 2 or FIG. 6. The shield sections 1 and 6 are connected together by solder, wires or other connection means and similar connections are provided between 3 and 5, 7 and 4, as well as 2 and 8.

OPERATION

As is known to all those skilled in the art, improvements in frequency converters for communication systems now stress greater operating bandwidths, lower conversion losses and higher output carrier power levels than previously. The present invention resulted from investigations into frequency converters which are driven from high power pump sources and modulated IF carriers in an effort to achieve a high power output carrier with the same modulation as the input IF carrier.

As is also well-known, the term "balun" is applied to a device for coupling signals from a balanced line to an unbalanced line or vice versa. The apparatus of FIG. 1 is such a balun and, in fact, may be more appropriately described as a microstrip balun with two pair of balanced leads.

In operation, an unbalanced transmission line may be connected between terminal 34 and ground plane 10. Signals applied to input 34 are coupled to the mulitpart paths such as 14 and 20 and to provide an output between terminals 24 and 26, which are 180 electrical degrees out-of-phase. The same action provides the identical output between terminals 28 and 30 due to the coupling between conductor 32 and the conductors 16 and 18. The balun can operate equally in the reverse direction and in other words if signals from a balanced line are applied between terminals 24 and 26, the signal will be output in an unbalanced condition between terminal 34 and ground plane 10 as a result of the coupling between multipart circuit paths 14 and 20 and the path 32. As will be noted, there is no direct ohmic connection between circuit path 32 and any of the areas on the associated conductive areas comprising the ground plane 10 or the multipart circuit paths. Thus, there is complete electrical isolation in direct current between these two areas. While a normal means for separating the conductive strip 32 from the coupling multipart circuit paths is to place these areas on opposite sides of a printed circuit board, any type of dielectric including air will perform the desired function.

It is my belief that the microstrip construction of a balun in accordance with the teachings of FIG. 1 is novel and patentably distinct whether the balun is a single or a dual balun device.

The thoughts behind the design of the dual balun of FIG. 1 is used in constructing the microstrip hybrid junction of FIG. 2. Really, the apparatus of FIG. 2 operates in a manner similar to that of a pair of dual baluns of FIG. 1. If a signal is input at terminal I, the "hot" or excited conductor of a transmission line is connected to portion 67 of the conductive strips 63 and 65 while the ground portion of the unbalanced transmission line is connected to ground plane 39. This signal may be picked off in a balanced condition at the general area of junction 47 with one pick off point at the junction of portions 51 and 53 of one multipart current path and another at the junction of portions 57 and 55 of another multipart current path. The same signal may be obtained from the portions of coupling material forming the other two current paths of FIG. 2.

As will be apparent to those skilled in the art, the hybrid junction of FIG. 2 may be easily modified to produce a double balanced frequency converter. As used in this application, the term, "frequency converter" is used to include downconverters or mixers and upconverters or modulators.

FIG. 3a illustrates an alternate version of the balun of FIG. 1 based somewhat on the principles illustrated in the Mouw patent referenced previously. As will be noted, the primary conductor is bifurcated to form two primary conductors 86 and 92. These two main conductors cooperate with the ground connected secondary balun current paths therebelow to form the two separate sets of outputs culminating in the pairs of leads 1 and 2, as well as 3 and 4.

FIG. 3b provides an electrical equivalent circuit of the balun of FIG. 3b. It will, thus, be noted that an approach based upon the Mouw teachings must be represented by two separate transformers (i.e., 124 and 126) whereas the present inventive concept would have an equivalent circuit of a transformer having a single primary and a pair of secondaries. Thus, either the right or left half of FIG. 4 may be used to represent the balun of FIG. 1.

The equivalent circuit of FIG. 4 is primarily provided to show the electrical characteristics of the hybrid junction of FIG. 2. It may be realized from examining FIGS. 2 and 4 that the lead 145 of FIG. 4 corresponds with portion 67 of FIG. 2, while the lead 173 of FIG. 4 corresponds with the portion 75 in FIG. 2. An output signal representative of one-half the input signal may be obtained either between leads 3 and 4 for an input on terminal I and the remaining output may be obtained between leads 1 and 2 for this same input. For an input on terminal II, an output would normally be taken either across 5 and 6 or across 7 and 8. The winding 147 may be likened to conductor 63 through 65 while winding 157 may be likened to conductive paths 49 and 59. Winding 163 may be likened to conductive paths 51 and 57. In like manner, winding 171 corresponds to path 69, 71 and 73, and the secondaries 159 and 161 correspond respectively to multipart paths 53-45 and 55-61.

By turning the hybrid junction apparatus of FIG. 2 over and adding the diodes of FIG. 5, as previously referenced, the apparatus shown in FIG. 6 is obtained. This may be properly termed a "mixer" wherein signals are applied to any two of the three terminals and the difference or sum signal is obtained from the third terminal. Typically, for upconverter operation, the IF signal is applied to terminal III and the pump signal is applied to one of terminals I and II and the output is obtained from the other of terminals I and II. Thus, if an input pump signal is applied at terminal I between conductive area 202 and ground plane 200, a potential is caused to appear between leads 1 and 2 as illustrated in FIG. 7 or the corresponding ends of multipart circuit paths in FIG. 6. An equal potential is also caused to appear between leads 3 and 4. The potentials from this input signal across leads 1 and 3 and also between 4 and 2 nearest the intersection area are equal in phase and amplitude. If a signal is fed into terminal II between lead 204 and ground plane 200, a potential will appear between the ends of leads 7 and 8 and also between 5 and 7 with the leads 5 and 7 and also 6 and 8 being of equal potential amplitude and phase. By joining the leads 1-6, 2-8, 4-7 and 3-5, as provided at the intersection of the multipart paths, a four terminal network is obtained. With the four diodes connected as illustrated, rectification is obtained whereby the output terminal III contains the sum of the IF voltages in phase from each diode.

If an input pump signal is applied at terminal I between conductive area 202 and ground plane 200 and an IF signal is applied between terminal 214 (III) and ground plane 200, a carrier output signal will appear at terminal II between conductive area 204 and ground plane 200. Thus, the mixer operation is obtained.

An examination of the electrical equivalent circuit of FIG. 7 shows that mutual isolation is provided between terminals I, II and III by both diode balance and circuit connections. As an example, the potential that appears between leads 1 and 2 from an input at terminal I will be applied across leads 6 and 8 from terminal II. Since leads 6 and 8 are at the same potential, no coupling will exist.

It may be thus determined that this circuit provides half-wave rectification for the RF signals at terminals I and II and full-wave rectification through two sets of parallel diodes for the IF signal at terminal III. The IF output is unbalanced so that no balun is required. The ground side of terminal III is provided by an ohmic connection to reference or ground plane 200.

In the design of the present invention, it was noted that saturation occurred in the diodes for higher power outputs. To reduce this saturation and also to reduce AM to PM (phase modulation distortion) conversion in the upconverter, it was determined to be desirable to isolate the DC return for the four diodes. This is accomplished by the capacitors 268 and 270 in FIG. 8, along with the inductors 262 and 272 and the resistances 264 and 274 which generate a reverse bias DC bias voltage to limit forward conduction of equal polarity pairs and to prevent one pair of diodes from forward biasing the other pair and causing diode saturation and thus, lowering the output signal.

While the circuit of FIG. 8 will operate satisfactorily if the diodes are substantially balanced (i.e., have nearly identical characteristics) it may be necessary to DC isolate all four diodes as illustrated in FIG. 9 where there is substantial diode unbalance (i.e., diode characteristics as received from the manufacturer). This design (of FIG. 9) does, in some instances, affect the conversion efficiency and the carrier balance in the output and thus is to be considered an alternate embodiment for high power applications where no diode selection is permitted. (Note that RF conduction from either terminals I or II takes place through two diodes via one capacitor only, thus reducing loss through capacitor series resistance).

It should be noted that, by separating the bias of the standard upconverter diodes, as illustrated in FIG. 8, as compared to that of FIG. 7, the power output was increased from 12 dbm to 15 dbm for an input pump power level of +29 dbm.

Although a double balanced mixer, as illustrated in FIG. 8, is satisfactory for most applications, this approach provides half-wave operation for the RF frequencies. In order to lower conversion loss, the circuit of FIG. 10 and its electrical equivalent of FIG. 12 was tried. This connection using a pair of diode quads allows an increase in conduction time for RF signals, thereby adding to the output sideband levels. It may be noticed that conduction now occurs in both directions between any two potentially different terminals. For instance, the voltage that occurs between multipart paths 321 and 327 from an input at 319 will conduct through diodes D1 and D5 for one polarity and through diodes D3 and D7 for the opposite polarity. The diodes are joined together in FIG. 10 so that high power operation will cause diodes of opposite polarity to forward bias each other and cause early saturation of the diodes. Although not illustrated, it is possible to separate the diodes on a DC basis as illustrated in FIGS. 8 and 9 for the dual quad diode configuration of FIG. 10.

It should be noted that the leads 1 through 8 of FIG. 12 are illustrated as being connected by a dash line to IF and DC ground. Thus, no isolation is necessary to cause an in-phase summation of all IF potentials from the diodes. However, a balun is necessary in the operation of the circuit of FIG. 10 since the two leads 331 and 333 are balanced to ground on the converter side of the balun 335.

As will be realized from a reading of the Mouw patent referenced previously, ring and star diode configurations often and here are electrically equivalent and, thus, FIG. 11 is merely used to illustrate the connection of the diodes to provide the same function as illustrated in FIG. 10.

In the operation of the present invention, an IF drive signal at terminal III of 70 megahertz was used in connection with a pump signal of a frequency of 2 GHz to obtain an output signal in the 2 GHz frequency range when the device is used as an upconverter.

From an observation of FIGS. 13 and 14 in conjunction with the information provided above, it will be apparent that the operation of these apparatus of the figures is substantially identical to that provided in connection with the previously discussed and illustrated embodiments. The advantage of the embodiment of FIG. 13 is that all of the terminals are on one side of the board, while an advantage of FIG. 13, as well as FIG. 14, is that there is adequate room for the diodes to lie flat against the dielectric in contrast to the vertical space problems of previously illustrated embodiments.

FIG. 15 is provided to show that the invention is not limited to microstrip technology, but rather, may be used with other technologies such as coaxial cables. While Mouw required four coaxial cables to practice his invention, the present invention operates satisfactorily with two coaxial cables and has a completely different electrical equivalent circuit, as well as a different conceptual implementation. While FIG. 15, as illustrated, is a hybrid junction, it can be easily modified by the addition of the diodes of FIG. 5 using the connections designated to provide a frequency converter. Again, the electrical equivalent circuit of FIG. 7 applies to FIG. 15 when the diodes of FIG. 5 are connected hereto.

Since the operation of baluns, hybrid junctions and mixer circuits are well-known to those skilled in the art, it is believed that the information presented above as to a new microstrip design for providing these functions is a complete teaching to one skilled in the art. I, therefore, wish to be limited not by the specific illustrations provided, but only by the scope of the appended claims.

I claim:

1. A broadband dual balun comprising, in combination:
   conductive ground plane means;
   first, second, third and fourth conductive paths connected to and extending from said ground plane means toward an area of common intersection, said first and second paths forming a first pair of terminals and said third and fourth paths forming a second pair of terminals; and
   non-bifurcated transmission line conduction means effectively forming an equivalent circuit having only one primary conductor and having at least first and second defined areas juxtaposed but spaced from said first, second, third and fourth paths for the length of the paths from said ground plane means to said area of common intersection, the first and second paths being associated with said first defined area of said conduction means and the third and fourth paths being associated with said second defined area of said conduction means.

2. A broadband microstrip dual balun comprising, in combination:
   dielectric means;
   ground plane means encompassing a given area on one side of said dielectric means;
   first, second, third and fourth conductive paths connected to and extending from said ground plane means toward an area of common intersection, said first and second paths forming a first pair of terminals and said third and fourth paths forming a second pair of terminals; and
   non-bifurcated fifth conductive path effectively forming an equivalent circuit having only one primary conductor on the opposing side of said dielectric means juxtaposed said first, second, third and fourth paths from the area of said ground plane means to said area of common intersection.

3. Microstrip hybrid apparatus comprising, in combination:
   dielectric means having first and second opposing sides;
   ground plane means electrically defining an open area and attached to said first side of said dielectric means;
   first, second, third, fourth, fifth, sixth, seventh and eighth current paths connected to and extending from said ground plane at a first end toward a common area within said open area at a second end;
   first connection means electrically connecting said second ends of said first and second current paths together;
   second connection means electrically connecting said second ends of said third and fourth current paths together;
   third connection means electrically connecting said second ends of said fifth and sixth current paths together;
   fourth connection means electrically connecting said second ends of said seventh and eighth current paths together;
   ninth current path means, attached to said second side of said dielectric means, juxtaposed said first, fourth, fifth and eighth current paths; and
   tenth current path means, attached to said second side of said dielectric means, juxtaposed said second, third, sixth and seventh current paths.

4. Hybrid junction apparatus, comprising, in combination:
   conductive ground plane means;
   first, second, third, fourth, fifth, sixth, seventh and eighth current paths connected to and extending from said ground plane at a first end toward a common area at a second end;
   first connection means electrically connecting said second ends of said first and second current paths together;
   second connection means electrically connecting said second ends of said third and fourth current paths together;
   third connection means electrically connecting said second ends of said fifth and sixth current paths together;
   fourth connection means electrically connecting said second ends of said seventh and eighth current paths together;
   first transmission line means, juxtaposed and spaced apart from said first, fourth, fifth and eighth current paths; and
   second transmission line means, juxtaposed and spaced apart from said second, third, sixth and seventh current paths.

5. Apparatus as claimed in claim 4, comprising, in addition:
   first signal terminal means connected to said first and second connection means; and
   second signal terminal means connected to said third and fourth connection means.

6. Apparatus as claimed in either of claims 3 or 4 for providing frequency converter operation comprising, in addition:
   IF signal diode quad means connected to said first, second, third and fourth connection means.

7. Microstrip hybrid apparatus comprising, in combination:
- conductive ground plane means circumscribing a generally nonconductive area;
- first second, third and fourth L-shaped conductive path means coacting to form a nonconductive area therebetween wherein the area has the shape of a cross, both ends of each of said path means being electrically connected to said ground plane means;
- fifth conductive path means juxtaposed, but spaced from, the portions of said first, second, third and fourth path means adjacent one pair of congruent arms of the cross; and
- sixth conductive path means juxtaposed, but spaced from, the portions of said first, second, third and fourth path means adjacent the other pair of congruent arms of the cross.

8. Hybrid junction apparatus comprising, in combination:
- conductive ground plane means;
- first, second, third and fourth conductive path means forming a nonconductive area therebetween in the shape of a cross with two pairs of intersecting arms wherein both ends of each of said path means is electrically connected to said ground plane means;
- first transmission line means juxtaposed, but spaced from, the portions of said first, second, third and fourth path means adjacent one of said pairs of intersecting arms of said cross; and
- second transmission line means juxtaposed, but spaced from, the portions of said first, second, third and fourth path means adjacent the other of said pair of intersecting arms of said cross.

9. Signal converter apparatus including the apparatus of claim 8 and comprising, in addition:
- IF signal terminal means;
- diode means connecting said IF signal terminal means to said first, second, third and fourth path means in the area of the intersection of the arms of the cross; and
- further terminal means connected to each of said first and second transmission line means.

10. Hybrid junction apparatus comprising, in combination:
- first signal transmission line conduction means, including first and second outside regions;
- ground plane means;
- first and second conductive path means connected to and extending from said ground plane means substantially equidistant lengths along and juxtaposed said first outside region of said first signal transmission line conduction means;
- third and fourth conductive path means connected to and extending from said ground plane means substantially equidistant lengths and juxtaposed said second outside region of said first signal transmission line conduction means;
- second signal transmission line conduction means, including first and second outside regions;
- fifth and sixth conductive path means connected to and extending from said ground plane means substantially equidistant lengths along and juxtaposed said first outside region of said second signal transmission line conduction means;
- seventh and eighth conductive path means connected to and extending from said ground plane means substantially equidistant lengths along and juxtaposed said second outside region of said second signal transmission line conduction means;
- first connection means connecting said first conductive path means to said sixth conductive path means;
- second connection means connecting said second conductive path means to said eighth conductive path means;
- third connection means connecting said third conductive path means to said fifth conductive path means; and
- fourth connection means connecting said fourth conductive path means to said seventh conductive path means.

11. Signal converter apparatus including the apparatus of claim 10 and comprising, in addition:
- means for applying pump frequency signals to said first signal transmission line conduction means;
- third signal transmission means; and
- quad diode means connected between said third signal transmission means and said first, second, third and fourth connection means for providing half-wave rectification of signals received from said first signal transmission line conduction means.

12. The method of providing signal frequency conversion comprising the steps of:
- coupling input pump signals from a first single conductor means to first and second pairs of conductive paths juxtaposed opposing sides of said first single conductor means;
- coupling signals between third and fourth pairs of conductive paths to opposite sides of a juxtaposed second single conductor means for providing converted output signals;
- inputting nonlinear intermediate frequency signals of a first polarity to one conductor of each of said pairs of conductive paths; and
- inputting nonlinear intermediate frequency signals of a second polarity to the remaining conductor of each of said pairs of conductive paths, said pairs of conductive paths connected to and extending from a ground plane means.

13. Hybrid junction apparatus comprising, in combination:
- first single conductor means having first and second ends;
- first and second pairs of conductive paths juxtaposed, but separated from, opposing sides of said first single conductor means, one conductive path of each pair being situated near said first end of said first single conductor means and the remaining conductor of each pair being situated near said second end of said first single conductor means;
- second single conductor means having first and second ends;
- third and fourth pairs of conductive paths juxtaposed, but separated from, opposing sides of said second single conductor means, one conductive path of each pair being situated near said first end of said second single conductor means and the remaining conductor of each pair being situated near said second end of said second single conductor means;
- ground plane means connected to a first end of each of said conductive paths near the terminuses of said first and second conductor means;
- first connection means connecting said first pair of conductive paths to a second end of one of each of said pairs of third and fourth conductive paths; and second connection means connecting said second pair of conductive paths to a second end of the other of each of said pairs third and fourth conductive paths.

14. Signal conversion apparatus including the hybrid junction of claim 13 and comprising, in addition:

means for supplying pump signals to said first single conductor means;

means for supplying IF signals to said first and second connection means for mixing with said pump signals; and means for outputting converted signals from said second single conductor means.

* * * * *

UNITED STATES PATENT AND TRADEMARK OFFICE
CERTIFICATE OF CORRECTION

PATENT NO. : 4,186,352
DATED : January 29, 1980
INVENTOR(S) : Ben R. Hallford

It is certified that error appears in the above-identified patent and that said Letters Patent are hereby corrected as shown below:

Column 1, line 60, delete "electricl" and substitute therefor --electrical--.

Column 2, line 11, after "path 20" insert --is--.

Column 6, line 22, delete "approprite" and substitute therefor --appropriate--.

Column 9, line 19, delete "to" and substitute therefor --at--.

Signed and Sealed this

Fifteenth Day of July 1980

[SEAL]

Attest:

SIDNEY A. DIAMOND

Attesting Officer

Commissioner of Patents and Trademarks